United States Patent
Cooper et al.

(10) Patent No.: US 6,954,159 B1
(45) Date of Patent: Oct. 11, 2005

(54) LOW DISTORTION BAND-PASS ANALOG TO DIGITAL CONVERTER WITH FEED FORWARD

(75) Inventors: Scott A. Cooper, Seattle, WA (US); Aanand L. Esterberg, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 115 days.

(21) Appl. No.: 10/612,829

(22) Filed: Jul. 1, 2003

(51) Int. Cl.[7] .............................................. H03M 3/00
(52) U.S. Cl. ................................... 341/143; 341/144
(58) Field of Search ................................ 341/143, 144

(56) References Cited

U.S. PATENT DOCUMENTS

| | | | |
|---|---|---|---|
| 3,958,236 A | 5/1976 | Kelly | |
| 4,163,947 A | 8/1979 | Weedon | |
| 4,763,105 A | 8/1988 | Chyun | |
| 4,914,440 A | 4/1990 | Ramet | |
| 4,962,380 A | 10/1990 | Meadows | |
| 4,968,988 A | 11/1990 | Miki et al. | |
| 5,099,156 A | 3/1992 | Delbruck et al. | |
| 5,177,697 A | 1/1993 | Schanen et al. | |
| 5,243,347 A | 9/1993 | Jackson et al. | |
| 5,319,268 A | 6/1994 | Lyon et al. | |
| 5,332,997 A | 7/1994 | Dingwall et al. | |
| 5,376,935 A | 12/1994 | Seligson | |
| 5,608,400 A | * 3/1997 | Pellon ........................ | 341/143 |
| 5,666,118 A | 9/1997 | Gersbach | |
| 5,710,563 A | 1/1998 | Vu et al. | |

(Continued)

FOREIGN PATENT DOCUMENTS

EP      0 298 618      1/1989

OTHER PUBLICATIONS

Bastos, et al., "A 12–bit Intrinsic Accuracy High–Speed CMOS DAC", IEEE Journal of Solid–State Circuits, vol. 33, No. 12, Dec. 1998, pp. 1959–1969.

Bugeja, et al., "A Self–Trimming 14–b 100–MS/s CMOS DAC", IEEE Journal of Solid–State Circuits, vol. 35, No. 12, Dec. 2000, pp. 1841–1852.

Bugeja, et al., "A 14–b, 100–MS/s CMOS DAC Designed for Spectral Performance", IEEE Journal of Solid–State Circuits, vol. 34, No. 12, Dec. 1999, pp. 1719–1732.

Carley, L. Richard, "Trimming Analog Circuits Using Floating–Gate Analog MOS Memory", IEEE Journal of Solid–State Circuits, vol. 24, No. 6, Dec. 1989, pp. 1569–1575.

Diorio, et al., "Adaptive CMOS: From Biological Inspiration to Systems–on–a–Chip"; IEEE, vol. 90, No. 3; Mar. 2002; pp 345–357.

Figueroa, et.; "A Floating–Gate Trimmable High DAC in Standard 0.25 um CMOS"; Nonvolatile Semiconductor Memory Workshop, Monterey, CA Aug. 2001; pp 46–47.

(Continued)

*Primary Examiner*—Jean Jeanglaude
*Assistant Examiner*—Joseph Lauture
(74) *Attorney, Agent, or Firm*—Thelen Reid & Priest LLP; David B. Ritchie

(57) ABSTRACT

A low-distortion band-pass delta-sigma analog-to-digital converter (ADC), including an odd-phase sample and hold circuit coupled to a even-phase resonator, improves tolerance to mismatches between analog circuit components. The low-distortion ADC includes a feed-forward signal path that reduces, or eliminates, the input signal beyond the first summation point. In this way, the dynamic range and matching accuracy required of the resonator is reduced. An odd-phase sample and hold circuit shifts S/H spurious signals out-of-band. A two-phase resonator reduces in-band noise degradation caused by any mismatches between the resonator components.

25 Claims, 13 Drawing Sheets

U.S. PATENT DOCUMENTS

| | | | |
|---|---|---|---|
| 5,734,288 A | | 3/1998 | Dolazza et al. |
| 5,757,219 A | | 5/1998 | Weedon et al. |
| 5,790,060 A | | 8/1998 | Tesch |
| 5,793,231 A | | 8/1998 | Whittaker |
| 5,825,317 A | | 10/1998 | Anderson et al. |
| 5,841,384 A | | 11/1998 | Herman et al. |
| 5,870,044 A | | 2/1999 | Dell'ova et al. |
| 5,870,048 A | | 2/1999 | Kuo et al. |
| 5,917,440 A | * | 6/1999 | Khoury ................. 341/143 |
| 5,933,039 A | | 8/1999 | Hui et al. |
| 5,952,891 A | | 9/1999 | Boundry |
| 5,952,946 A | | 9/1999 | Kramer et al. |
| 5,955,980 A | | 9/1999 | Hanna |
| 5,982,313 A | | 11/1999 | Brooks et al. |
| 5,982,315 A | | 11/1999 | Bazarjani et al. |
| 6,118,398 A | | 9/2000 | Fisher et al. |
| 6,130,632 A | | 10/2000 | Opris |
| 6,137,431 A | | 10/2000 | Lee et al. |
| 6,169,503 B1 | | 1/2001 | Wong |
| 6,172,631 B1 | | 1/2001 | Tsai et al. |
| 6,191,715 B1 | | 2/2001 | Fowers |
| 6,317,066 B1 | | 11/2001 | Chiang |
| 6,373,417 B1 | | 4/2002 | Melanson |
| 6,373,418 B1 | * | 4/2002 | Abbey ................. 341/143 |
| 6,424,279 B1 | | 7/2002 | Kim et al. |
| 6,496,128 B2 | | 12/2002 | Wiesbauer et al. |
| 6,522,275 B2 | | 2/2003 | May |
| 6,570,518 B2 | | 5/2003 | Riley et al. |
| 6,573,853 B1 | | 6/2003 | Mulder |
| 6,583,740 B2 | | 6/2003 | Schofield et al. |
| 6,587,061 B2 | | 7/2003 | Petrofsky |
| 6,664,909 B1 | | 12/2003 | Hyde et al. |

OTHER PUBLICATIONS

Gray, et al., "Analysis and Design of Analog Integrated Circuits", Second Edition, University of California, Berkeley, 1984, pp. 66–71.

Hyde, et al.; "A Floating–Gate Trimmed, 14–Bit, 250 Ms/s Digital–to–Analog Converter in Standard 0.25 um CMOS", Impinj 2002 Symposium on VLSI Circuits, Honolulu HI; pp 328–331.

Tille, et al., "A 1.8–V MOSFET–Only $\Sigma$ Modulator Using Substrate Biased Depletion–Mode MOS Capacitors in Series Compensation", IEEE, Journal of Solid–State Circuits, vol. 36, No. 7, Jul. 2001, pp. 1041–1046.

Van der Plas, et al., "A 14–bit Instrinsic Accuracy $Q^2$ Random Walk CMOS DAC", IEEE Journal of Solid–State Circuits, vol. 34, No. 12, Dec. 1999, pp. 1708–1718.

Vittoz, "Dynamic Analog Techniques", Design of MOS VLSI Circuits for Telecommunications, 1985, pp. 145–170. No month known.

Vittoz, "Dynamic Analog Techniques", Design of Analog–Digital VLSI Circuits for Telecommunications and Signal Processing, Chapter 4, 1994, pp. 97–124. month unknown.

Vittoz, "Analog–Digital Conversion Techniques for Telecommunications Applications", Design of Analog–Digital VLSI Circuits for Telecommunications and Signal Processing, Chapter 9, 1994, pp. 289–315. month unknown.

Vittoz, "Delta–Sigma Data Converters", Design of Analog–Digital VLSI Circuits for Telecommunications and Signal Processing, Chapter 10, 1994, pp. 317–339. month unknown.

* cited by examiner

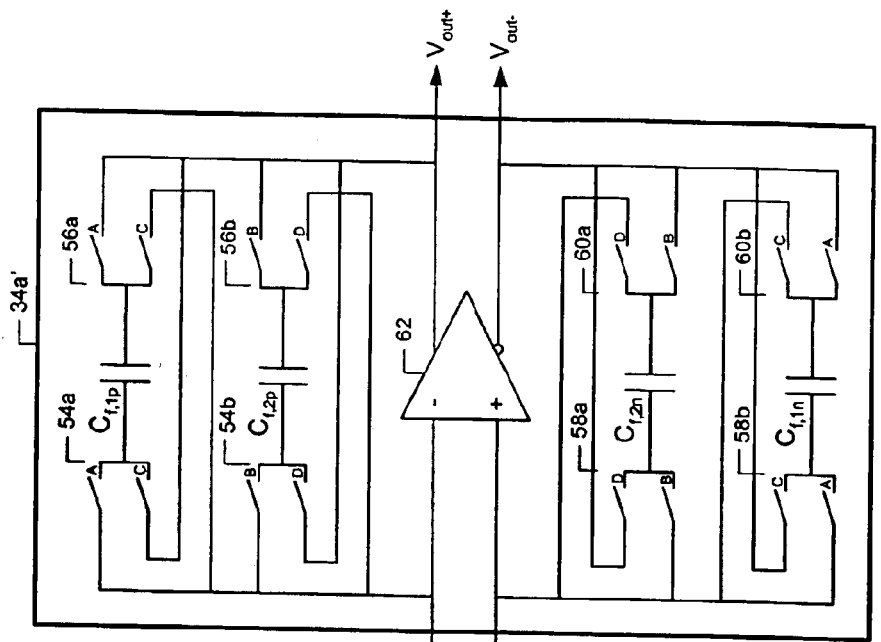
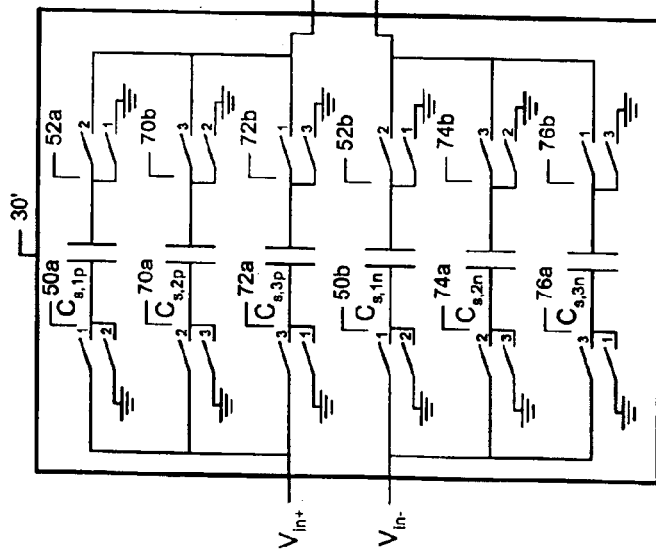
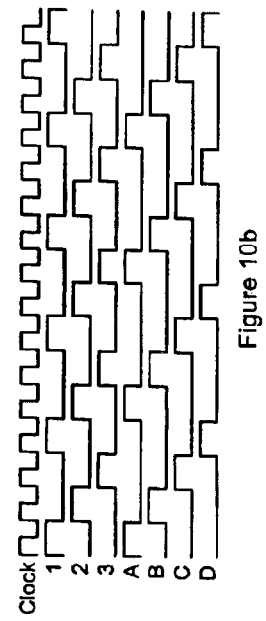
Figure 10a
Figure 10b

LOW DISTORTION BAND-PASS ANALOG TO DIGITAL CONVERTER WITH FEED FORWARD

BACKGROUND OF THE INVENTION

1. Field of the Invention

The present invention relates generally to the field of circuits and more particularly to analog-to-digital converters.

2. Related Art

Advances in semiconductor manufacturing technologies have decreased the physical dimensions of the circuit and interconnect elements in integrated circuits. One consequence of these physical changes is the introduction of integrated circuits that operate at high speed, and that also include many functions on a single integrated circuit. The electrical and electronic systems made possible by these high-speed, high-function integrated circuits also require improved analog circuits to provide performance commensurate therewith. One exemplary class of such analog circuits is referred to as analog to digital converters. Some of these circuits include another class of analog circuit configuration referred to as switched capacitor circuits.

Analog to digital converters that use switched-capacitor analog circuits suffer from performance degradations such as reduced signal-to-noise ratio (SNR) and in-band spurious signals, because of the finite precision of the analog elements used to implement such circuits.

By way of illustration, switched capacitor circuits are used in the known delta-sigma analog-to-digital converter (ADC) that is implemented with multi-phased sample-and-hold (S/H) circuits and multi-phased resonators. Multi-phased S/H circuits may allow more time to complete the capture of an input signal than a single-phase S/H circuit. This eases the speed requirements on the S/H circuitry. Multi-phased resonators are used to implement band-pass delta-sigma ADC circuits. The elements within a multi-phased circuit are matched to prevent performance degradation.

FIG. 1a shows a conventional analog to digital converter having two main parts: a modulator 5 and a digital signal processing (filter) section 7. The modulator 5 accepts an analog input at its input terminal and applies it to a sample and hold circuit 10. Resonators 14 and quantizier 20 output a digital signal (word) to feedback digital to analog converter 22.

FIG. 1b shows in detail an example of a modulator 5 of the FIG. 1a ADC having a S/H circuit 10 followed by two second order band-pass resonators 14, 18. The combination of the resonators gives a fourth order response. Also included is a summer 16, N-bit quantizer 20, and N-bit DAC 22 connecting to feedback summer 12. In a conventional implementation the characteristics of the capacitors and switches within the S/H circuit are matched to each other to prevent performance degradation. It is known that imperfections and mismatches in analog components (switches and capacitors) result in undesirable noise and spurious products. Such imperfections include timing skews across switches, parasitic resistance and capacitance, and the absolute and relative linearity of the components. Likewise, in a conventional implementation the elements within the resonator are matched. It is noted that perfect matching of such analog components is difficult, if not impossible.

The consequences of imperfections and mismatched components in a conventional fourth order band-pass delta-sigma ADC, such as that shown in FIG. 1a, are shown in the spectra of FIGS. 2, 3, and 4, and are also summarized in Table 1.

FIG. 2 shows the spectrum at the output port of a modulator of a conventional delta-sigma ADC having a single-phase S/H circuit and a two-phase resonator. The spectrum contains noise and spurious signals resulting from 1% mismatches in the resonator capacitors. The center of the signal band is at a normalized frequency of 0.25, where the sampling frequency (Fs) equals 1. The signal band is bounded by the band-pass filter response which is ultimately applied in the digital signal processing output stage of the ADC. Noise and signals within the signal band degrade the ADC performance. Noise and signals outside the signal band are rejected by the band-pass filter and are typically not a concern. In this example, resonator capacitor mismatches create an in-band spurious signal and produce a limited amount of in-band noise. In-band noise in this example is tolerable, but the in-band spur is problematic.

FIG. 3 shows the spectrum at the output port of a modulator of a conventional delta-sigma ADC having a single-phase S/H and a three-phase resonator. The spectrum contains the noise and spurious signals resulting from 1% mismatches in the resonator capacitors. In this example, resonator capacitor mismatches create out-of-band spurious signals, but also produce excessive in-band noise. In this case, the out-of-band spurs are tolerable, but the in-band noise is problematic.

FIG. 4 shows the spectrum at the output port of a modulator of a conventional delta-sigma ADC having a two-phase S/H circuit and a three-phase resonator. A two-phase S/H circuit provides the benefit of operating the S/H circuit elements at half speed. The spectrum contains the noise and spurious signals resulting from 1% mismatches in the S/H circuit and resonator capacitors. S/H circuit capacitor mismatches create an in-band spurious signal, while resonator capacitor mismatches create out-of-band spurs together with excessive in-band noise. In this case, the out-of-band spurs may be tolerable, but the in-band spurs and noise are problematic.

Methods and apparatus are therefore needed for reducing in-band noise and spurs that are due to mismatches and imperfections in components.

SUMMARY

Briefly, a low-distortion band-pass delta-sigma analog-to-digital converter (ADC), including an odd-phase (e.g., 1, 3, 5, . . . phase) sample and hold (S/H) circuit coupled to an even-phase resonator (e.g., 2, 4, 6, 8 . . . phase), improves tolerance to mismatches between analog circuit components. The low-distortion delta-sigma ADC includes a feed-forward signal path that serves to reduce, or eliminate, the input signal beyond the first summation point. In this way, the dynamic range and matching accuracy required of the resonator are reduced. An odd-phase sample and hold circuit shifts spurious signals of the S/H circuit to an out-of-band portion of the spectrum. An even-phase (e.g., two) resonator reduces in-band noise degradation due to mismatches between resonator components. The band is determined by, e.g., a digital signal processing filter output section as described above.

In one embodiment, a switched capacitor circuit is used in the low-distortion band-pass delta-sigma analog-to-digital converter.

BRIEF DESCRIPTION OF THE DRAWINGS

The present invention will be described by way of exemplary embodiments, illustrated in the accompanying drawings in which like references denote similar elements.

FIG. 10a is a circuit schematic of a switched capacitor three-phase sample and hold and two-phase resonator configured for capacitor flipping; FIG. 10b is the accompanying timing diagram.

DETAILED DESCRIPTION

In the following description, various aspects of the present invention will be described. However, it will be apparent to those skilled in the art that the present invention may be practiced with only some, or with all, aspects of the present invention. For purposes of explanation, specific numbers, materials and configurations are set forth in order to provide a thorough understanding of the present invention. However, it will also be apparent to one skilled in the art, that the present invention may be practiced without those specific details. In other instances, well-known features are omitted or simplified in order not to obscure the present invention.

Reference herein to "one embodiment", "an embodiment", or similar formulations, means that a particular feature, structure, or characteristic described in connection with the embodiment, is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

In general, embodiments of the present invention provide for the construction and operation of high performance, band-pass, delta-sigma ADCs that are tolerant to imperfectly matched analog components. Useful performance measures are in-band signal-to-noise ratio (SNR) and spurious levels. The methods and circuits described herein benefit, at least, band-pass single or multiple-loop delta-sigma ADC circuits that include single or odd-phased sampling and even-phased resonators in a low distortion architecture. When multi-phased sampling is used the constituent parts of the ADC can operate more slowly, an additional advantage in high speed ADCs.

Figure 5:
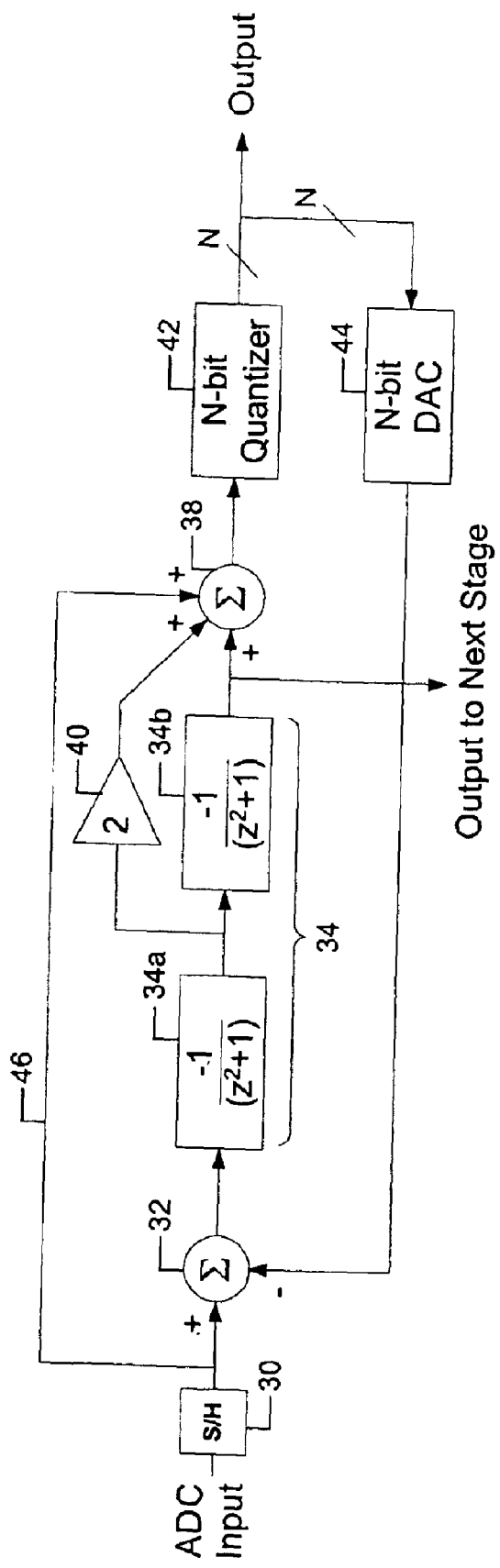
FIG. 5 is a block diagram showing a low distortion fourth-order band-pass delta-sigma ADC modulator in accordance with the present invention.

A low distortion delta-sigma ADC modulator in accordance with this disclosure is shown in FIG. 5. The FIG. 5 ADC modulator has an S/H circuit 30 connected via summing node 32 to a fourth order band pass resonator consisting of two second order band pass resonators 34a, 34b, with resonator 34b (and ×2 gain stage 40) and feed-forward line 46 connected to summing node 38. Quantizer 42 and feedback DAC 44 are similar to elements 20, 22 in FIG. 1b. (A DSP filter output section is provided in this ADC as in FIG. 1a but not shown here.) Such a low distortion delta-sigma ADC modulator differs from the FIG. 1a ADC modulator by including the feed-forward signal path line 46 that reduces or eliminates the input signal beyond the first summation node 32. A benefit of this circuit is reduced dynamic range and matching accuracies required of the resonators 34a, 34b.

While gain stage 40 is shown here as having a gain of 2, it may have any other predetermined amount of gain. Also, feed forward line 46 while shown here as being a gain stage having a gain of 1, it also may supply any other predetermined amount of gain.

Figure 1A:
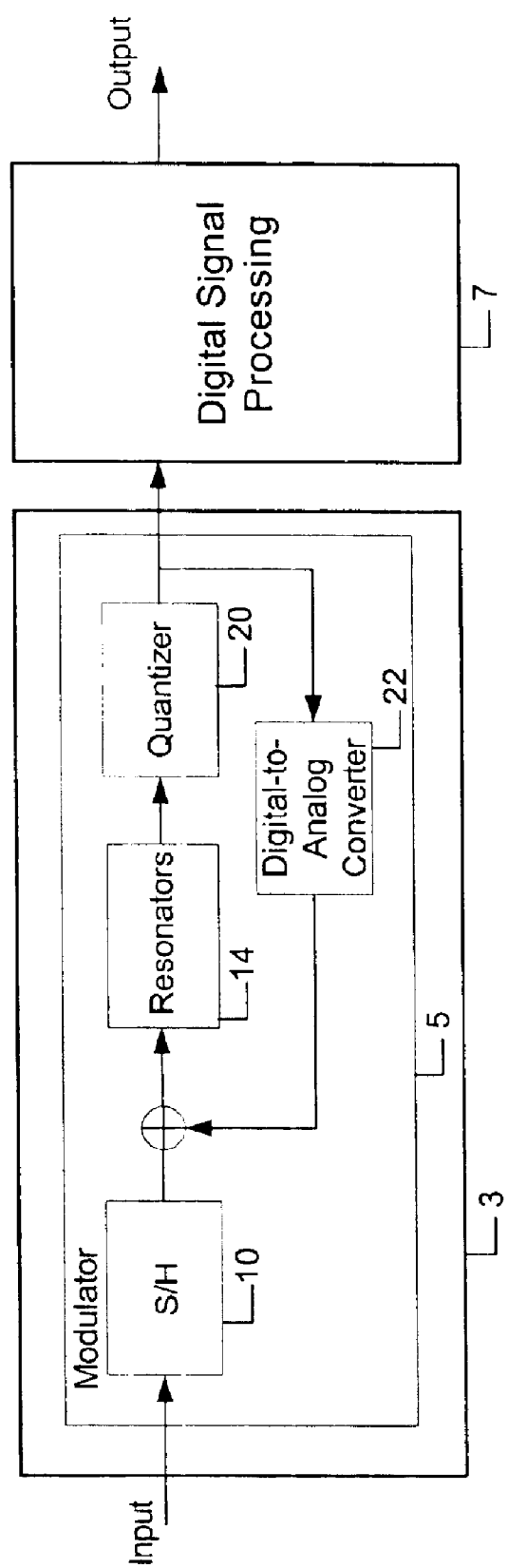
FIG. 1a is a block diagram of a conventional band-pass delta-sigma analog-to-digital converter.
Figure 1B:
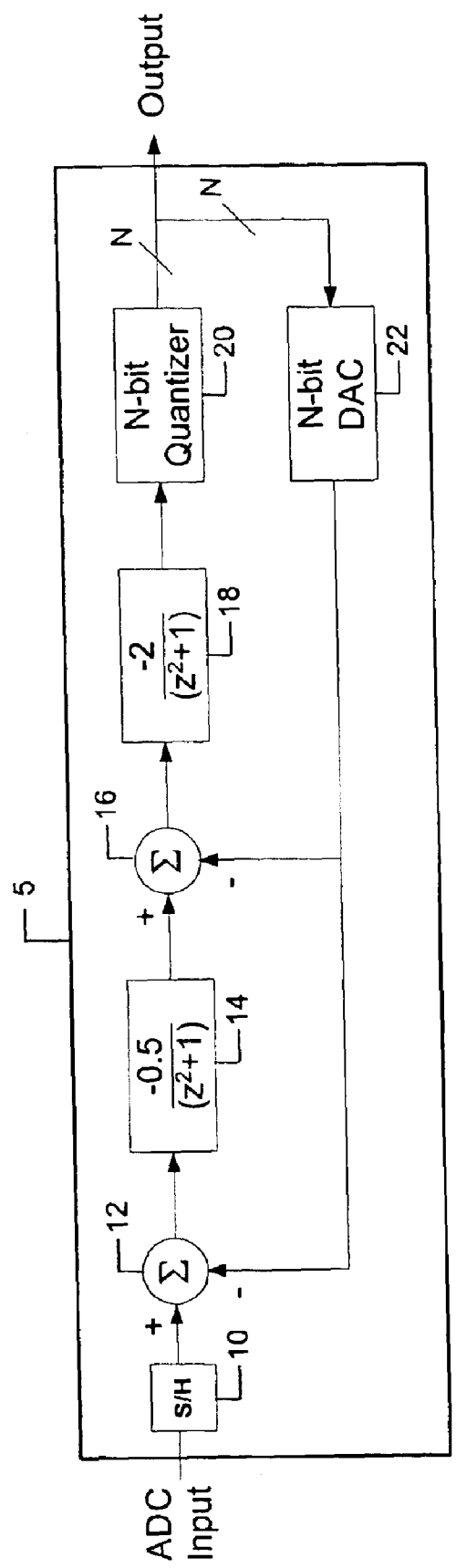
FIG. 1b is a block diagram of the modulator of the FIG. 1a converter.
Figure 2:
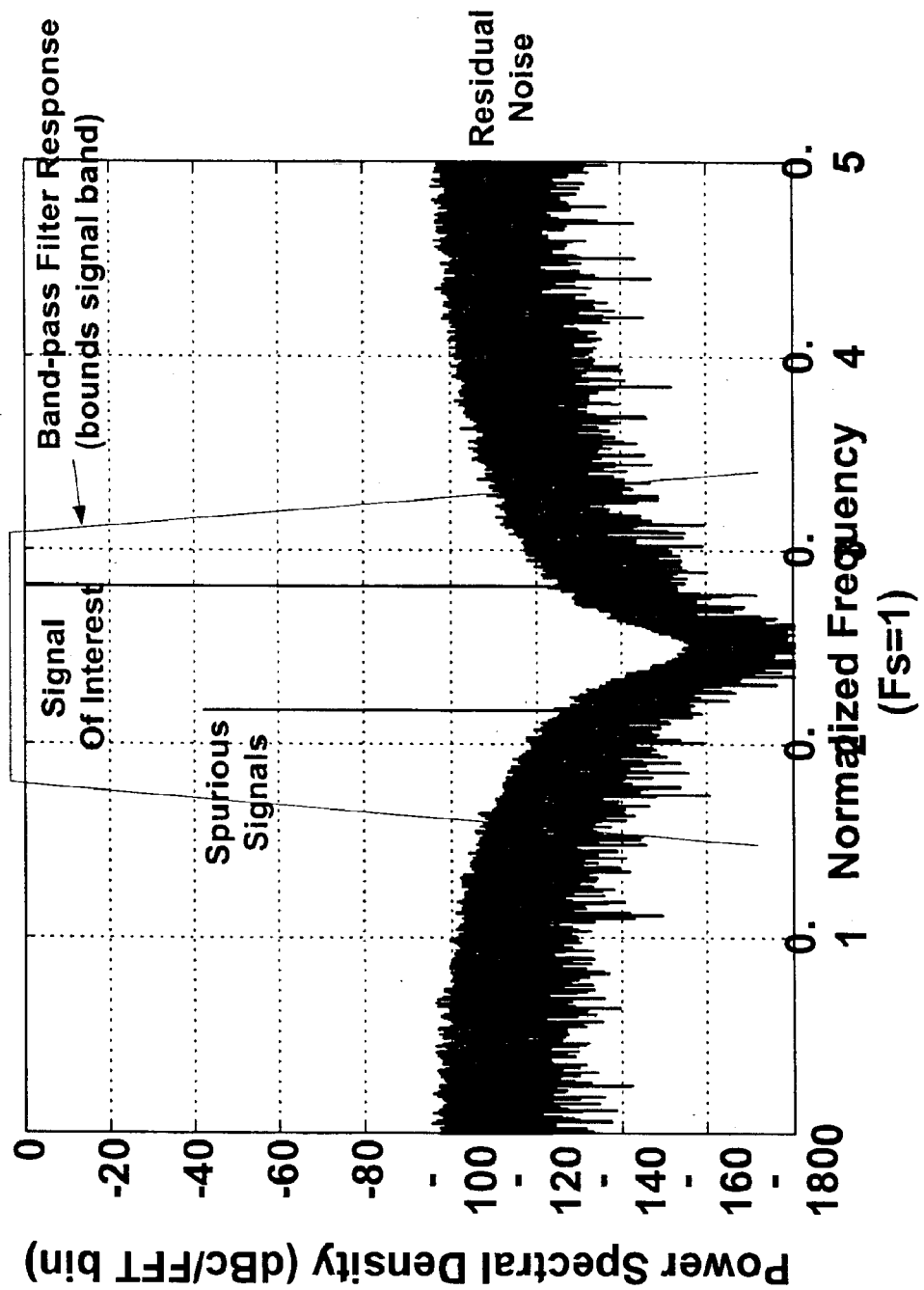
FIG. 2 shows the spectrum at the modulator output of FIG. 1b of a conventional delta-sigma ADC with a single-phase S/H circuit and a two-phase resonator.
Figure 3:
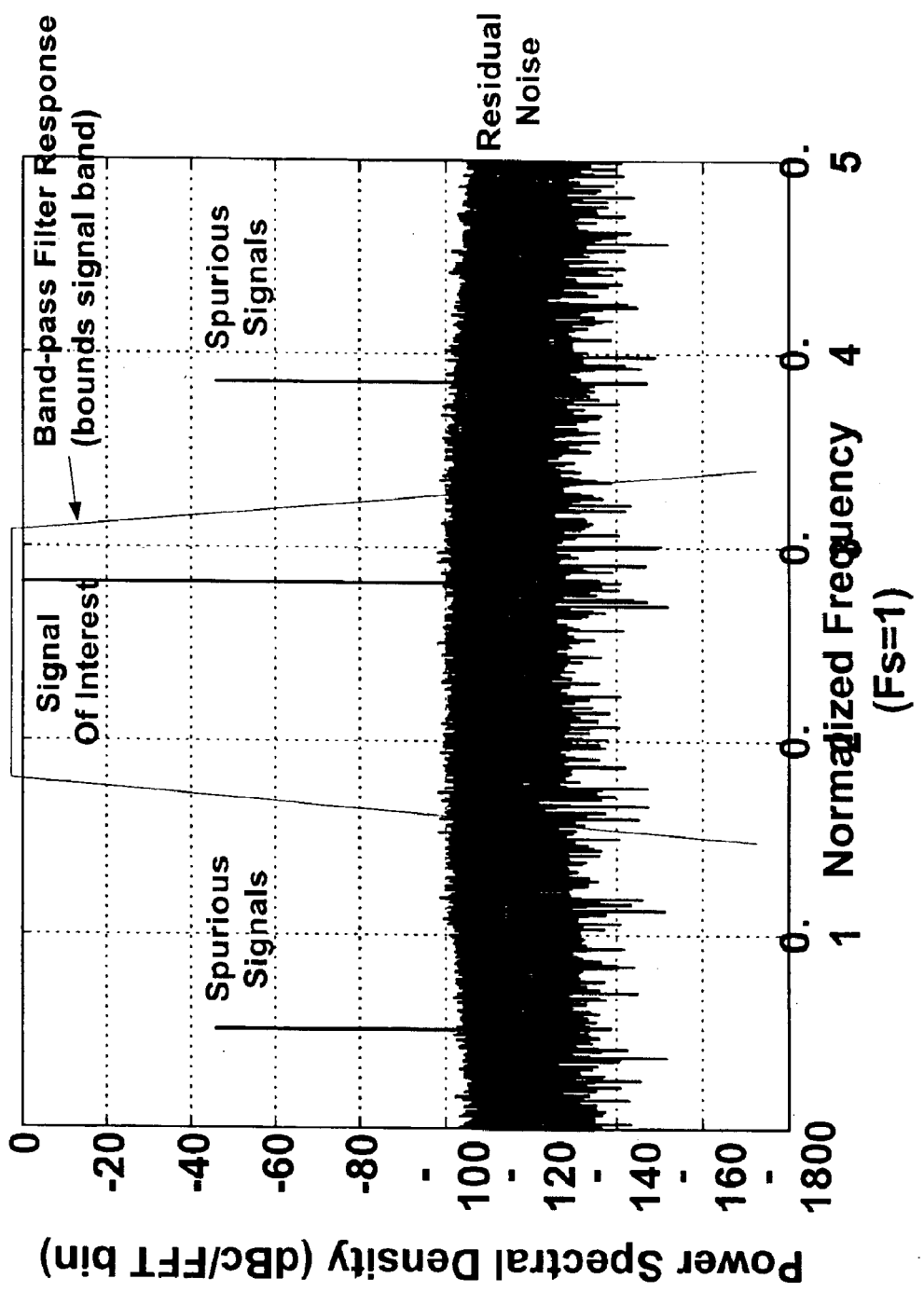
FIG. 3 shows the spectrum at the modulator output of a conventional delta-sigma ADC with a single-phase S/H and a three-phase resonator.
Figure 4:
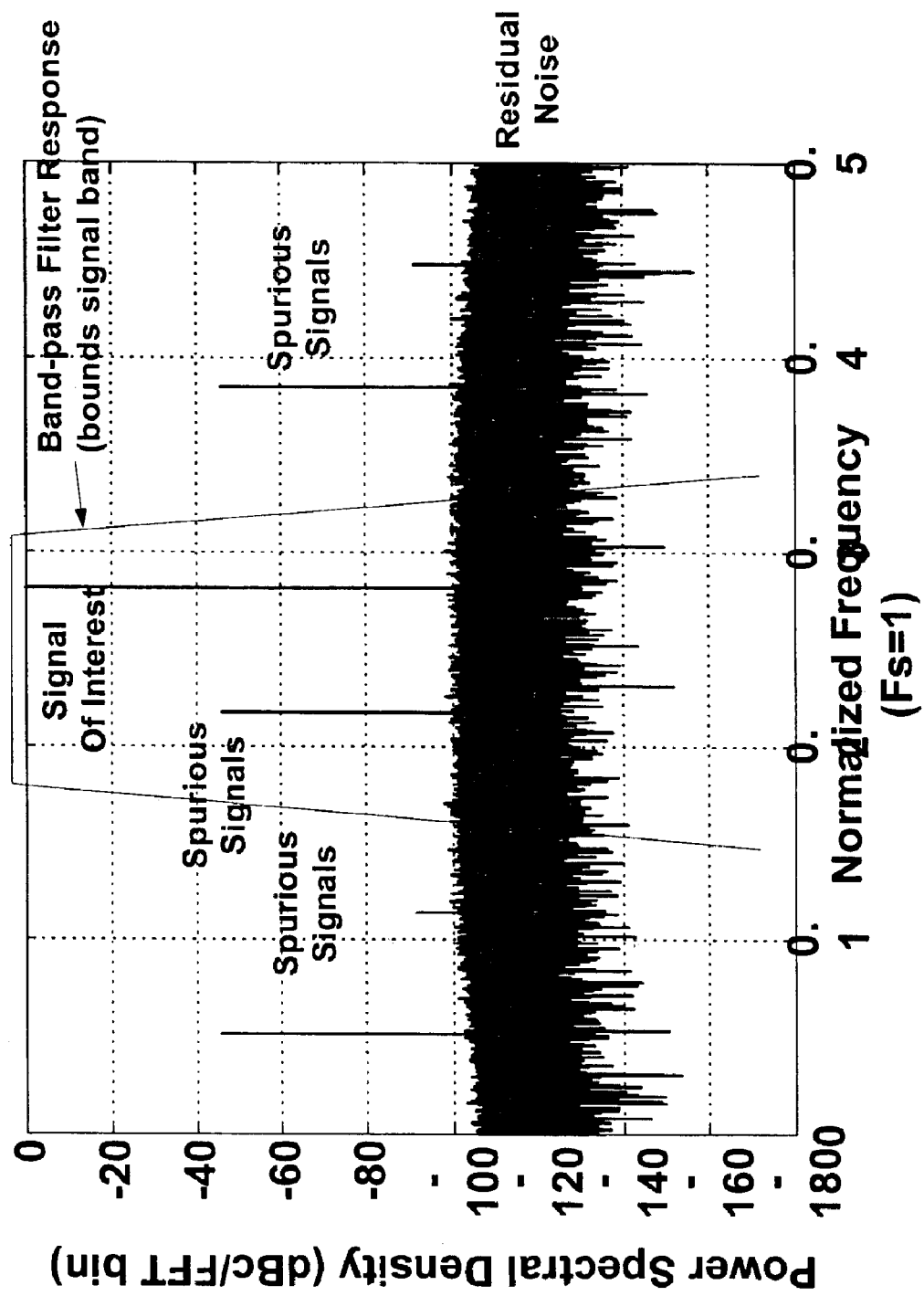
FIG. 4 shows the spectrum at the modulator output of a conventional delta-sigma ADC with a two-phase S/H circuit and a three-phase resonator.

Table 1, below, summarizes the effect of mismatches between components of the S/H circuit and the resonator for various multi-phase combinations of conventional delta-sigma ADCs as in FIG. 1a. The expression "Low Spurs" in Table 1 denotes the case where the spurs fall out-of-band. It is noted that there is no condition in Table 1 that provides the desirable goal of simultaneously low spurs and low noise. This provides a significant challenge to providing high speed, high performance delta-sigma ADCs.

TABLE 1

| | RESONATOR PHASES | |
|---|---|---|
| S/H Phases | 2 | 3 |
| 1 | High Spurs | Low Spurs |
| | Low Noise | High Noise |
| 2 | High Spurs | High Spurs |
| | Low Noise | High Noise |
| 3 | High Spurs | Low Spurs |
| | Low Noise | High Noise |

Various high speed, high performance delta-sigma ADCs that have been tried in the art include (a) more accurate matching of analog components; (b) a conventional band-pass delta-sigma ADC using a single-phased, double-phased, or multi-phased sample and hold circuit coupled to a double-phased resonator; and (c) a conventional band-pass delta-sigma ADC using a single-phased or double-phased sample and hold circuit coupled to a multi-phased resonator. Unfortunately, these approaches are not adequate. More particularly, the first approach is unattractive because accurate matching of circuits implies physically larger components, higher power, or large amounts of design effort to ensure compliance. The second approach is unattractive because the mismatches of a double-phased resonator create in-band interleaving spurs, and reduction of the interleaving spurs requires accurate matching of the analog components. The third approach is unattractive because the mismatches of a double-phased sample and hold circuit create in-band interleaving spurs, and the multi-phased resonator causes an increase in the noise. Reduction of the interleaving spurs and the noise requires accurate matching of the analog components.

Embodiments of the present invention, described in greater detail below, overcome challenges to providing high speed, high performance delta-sigma ADCs by incorporating a low distortion aspect into the delta-sigma ADC, and by providing phases for the S/H circuit and resonator as described herein. Some embodiments advantageously allow relaxed requirements for analog component matching.

Various embodiments provide a band-pass delta-sigma ADC modulator including the low distortion aspect shown in FIG. 5. An odd-phase (e.g., single-phase or three-phase) S/H circuit 30 is employed with an even-phase (e.g., two-phase) resonator 34. An odd-phase S/H circuit 30 assures that S/H spurious signals are out-of-band. Two-phased resonator 34 reduces or eliminates the in-band noise degradation due to resonator component mismatches.

Figure 6:
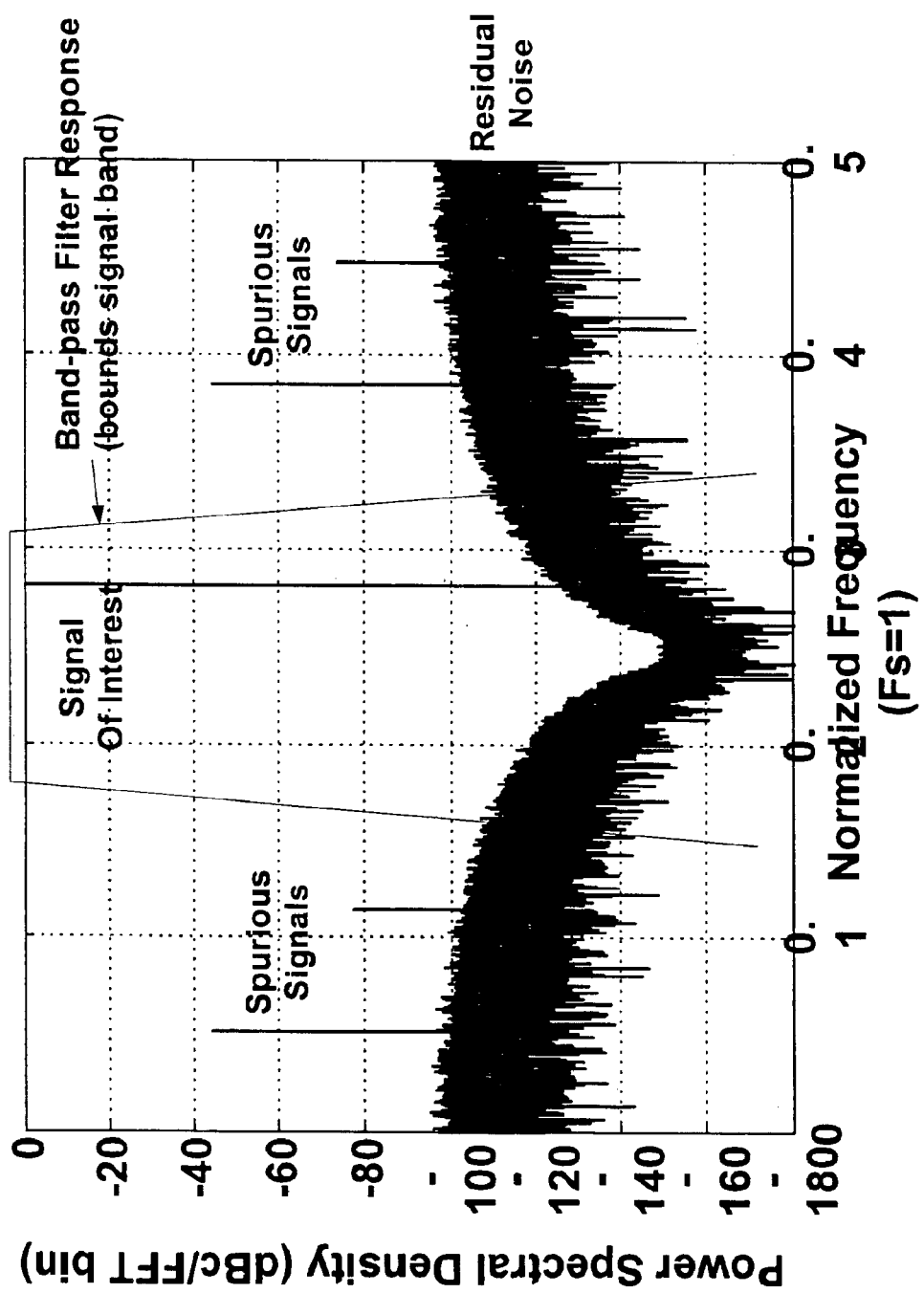
FIG. 6 shows the spectrum at the out terminal of a low-distortion delta-sigma ADC modulator having a three-phase S/H circuit and a two-phase resonator.

FIG. 6 shows the spectrum at the output of a low distortion delta-sigma ADC modulator of FIG. 5. The three-phase S/H provides the benefit of operating the S/H components at half speed. The spectrum shows the noise and spurious signals resulting from 1% capacitance mismatches in the S/H and resonators. S/H mismatches create out-of-band spurious signals with respect to the band defined by the resonator 34. No resonator spurs are present since the signal has been cancelled prior to reaching the resonator. The two-phase resonators produce tolerable levels of in-band noise. In this case, the spurs are out-of-band and the in-band noise is tolerable. Therefore the combination of a low distortion modulator and the selection of an odd-phase S/H 30 with an even-phase resonator 34 enables a high speed, high performance band-pass delta-sigma ADC.

Table 2 summarizes the effect of S/H and resonator component value mismatches for multi-phase combinations of a low-distortion ADC in accordance with the present invention. There are two cases, as shown in Table 2, that simultaneously achieve Low Spurs and Low Noise. The three-phase S/H case provides the additional benefit of operating much of the ADC circuitry at half speed compared to a single phase S/H.

TABLE 2

| S/H Phases | Resonator Phases | |
|---|---|---|
| | 2 | 3 |
| 1 | Low Spurs<br>Low Noise | Low Spurs<br>High Noise |
| 2 | High Spurs<br>Low Noise | High Spurs<br>High Noise |
| 3 | Low Spurs<br>Low Noise | Low Spurs<br>High Noise |

Two aspects of the present ADC are: the low distortion (feed forward path) such as illustrated in FIG. 5; and the use of an odd-phase S/H circuit 30 with an even-phase resonator 34.

The low distortion aspect reduces or eliminates the signal at the resonator thereby eliminating resonator spurs that normally appear in-band in a conventional ADC. Only quantization noise reaches the resonators. An odd-phase S/H circuit and even-phase resonator are used in conjunction with the low distortion aspect in various embodiments. An idealized two-phase resonator includes two identical series-connected delay elements with the output signal of the second delay element fed back to the first delay element. Resonators are inherently two-phase in a band-pass ADC. Component mismatches or imperfections in the delay elements of the resonator result in performance degradations which may result in either creating interleaving spurs, and/or in-band noise.

As noted above, a single-phase S/H circuit may be used with a two-phase resonator. The single-phase S/H circuit does not generate interleaving spurs since multiple elements do not exist.

A three-phase S/H circuit may also be used with the two-phase resonator. For a band-pass delta-sigma ADC with the center of the band at $F_s/4$, a three-phase S/H circuit generates out-of-band interleaving spurs. Assuming the center frequency, $F_o$, is near $F_s/4$, the interleaving spurs will be near $F_{spur}=F_s/3-F_s/4=F_s/12$, and $F_{spur}=2F_s/3-F_s/4=5F_s/12$.

Optimal performance may not be achieved with a two-phase S/H. A two-phase S/H circuit generates in-band interleaving spurs at $F_s/2-F_o$. Since Fo is near $F_s/4$, the interleaving spurs will be in-band near $F_s/4$.

Additional circuit and operational detail for the S/H circuit and resonator are illustrated in FIGS. 7–11. Examples of single-phase S/H circuits coupled to a two-phase resonator are shown in FIGS. 7a and 8a. Examples of three-phase differential S/H circuits coupled to two-phase differential resonators are shown in FIGS. 9 and 10a.

Figure 7A:
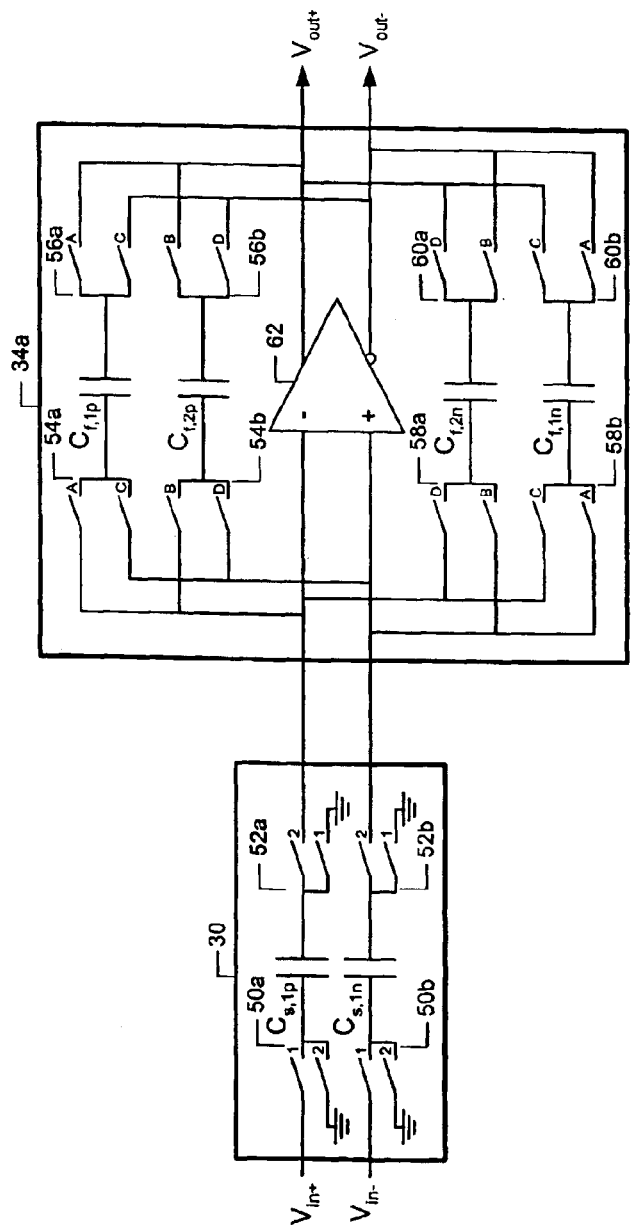
FIG. 7a is a circuit schematic of a switched capacitor single-phase sample and hold and two-phase resonator configured for capacitor switching.
Figure 7B:
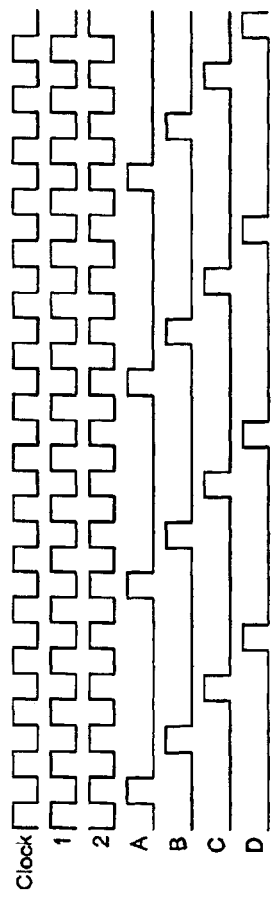
FIG. 7b is the accompanying timing diagram.

The second order, two-phase resonator 34a shown in detail in FIG. 7a has two sets of feedback capacitors and operates by capacitor switching. Resonator 34a includes paired switches (e.g., FETs) 50a, 50b; 52a, 52b; 54a, 54b, 56a, 56b; 58a, 58b; 60a, 60b, and conventional operational amplifier 62 all in one integrated circuit in one embodiment. Switches 50b, 56b, each have one terminal connected to ground. The values of the capacitors are a matter of conventional design choice. The capacitor values are preferably relatively small to economize on chip real estate, but large enough to minimize noise. These on-chip capacitors are fabricated by, e.g., a conventional CMOS process or defined by the chip metallization layers. Not shown is on-chip control circuitry, e.g., a state machine, that controls the FET switches as shown in the accompanying timing diagrams. Resonator 34a operates on a four-phase clock signal. (See accompanying timing diagram FIG. 7b labeled to show waveforms at various nodes in FIG. 7a.) At startup, or upon reset, the charge on the capacitors is cleared. On phase A, capacitors Cf,1p and Cf,1n are connected to the operational amplifier 62. On phase B, the capacitors Cf,2p and Cf,2n are connected to the operational amplifier 62. On phase C, the capacitors Cf,1p and Cf,1n are connected to the opposite terminals of the operational amplifier 62. On phase D, the capacitors Cf,2p and Cf,2n are connected to the opposite terminals of the operational amplifier 62. FIG. 7a (and other circuits shown in FIGS. 8a, 9a, 10a) are implemented, e.g. as integrated circuits with on-chip capacitors, but this is not limiting.

Figure 8A:
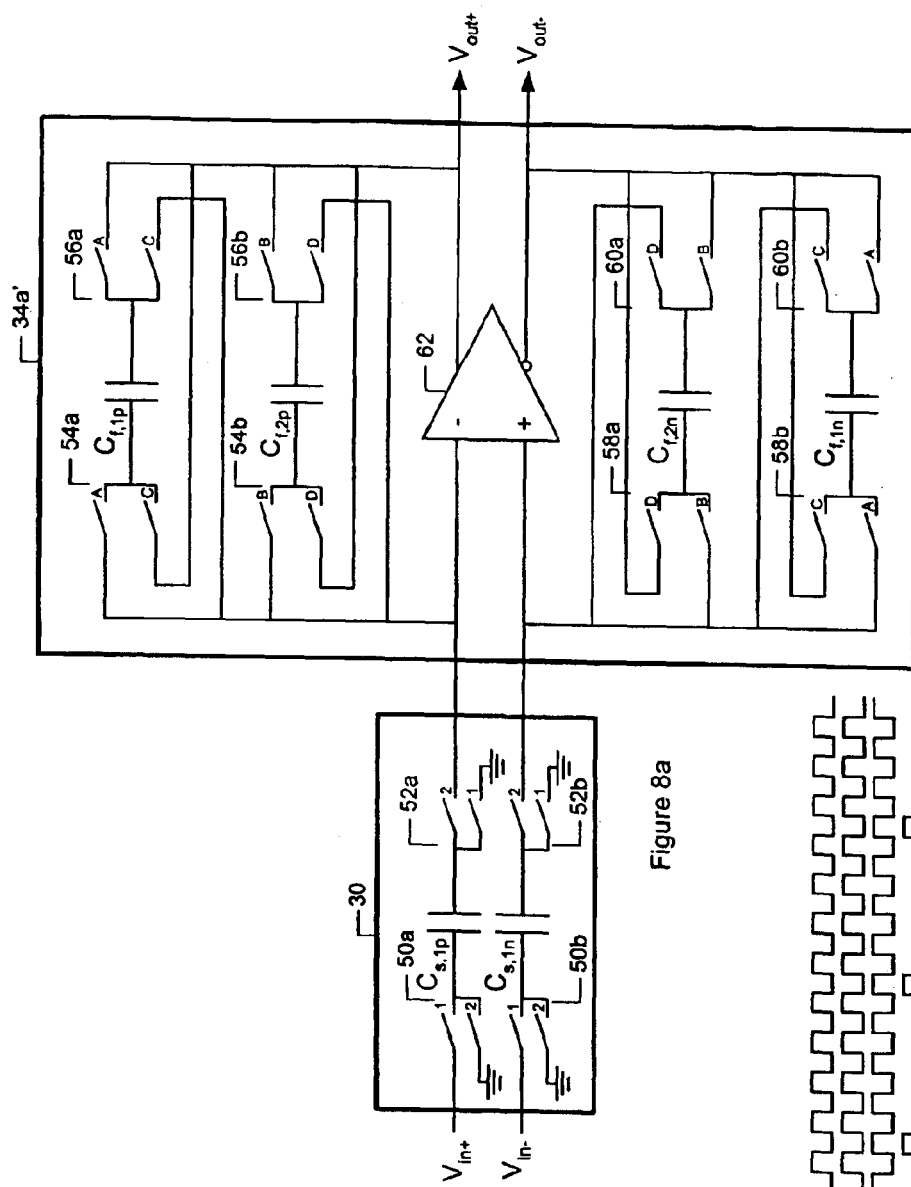
FIG. 8a is a circuit schematic of a switched capacitor single-phase sample and hold and two-phase resonator configured for capacitor flipping.
Figure 8B:
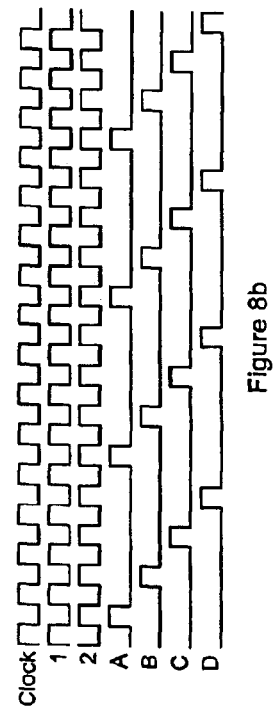
FIG. 8b is the accompanying timing diagram.

The second order, two-phase resonator 34a' in FIG. 8a has two sets of feedback capacitors and operates by, e.g., capacitor flipping. Resonator 34a' operates on a four-phase clock signal. (See timing diagram FIG. 8b.) At startup, or upon reset, the charge on all the capacitors is cleared. On phase A, capacitors Cf,1p and Cf,1n are connected to operational amplifier 62. On phase B, capacitors Cf,2p and Cf,2n are connected to operational amplifier 62. On phase C, the polarity of capacitors Cf,1p and Cf,1n is reversed and connected to operational amplifier 62. On phase D, capacitors Cf,2p and Cf,2n are reversed and connected to operational amplifier 62.

Figure 9A:
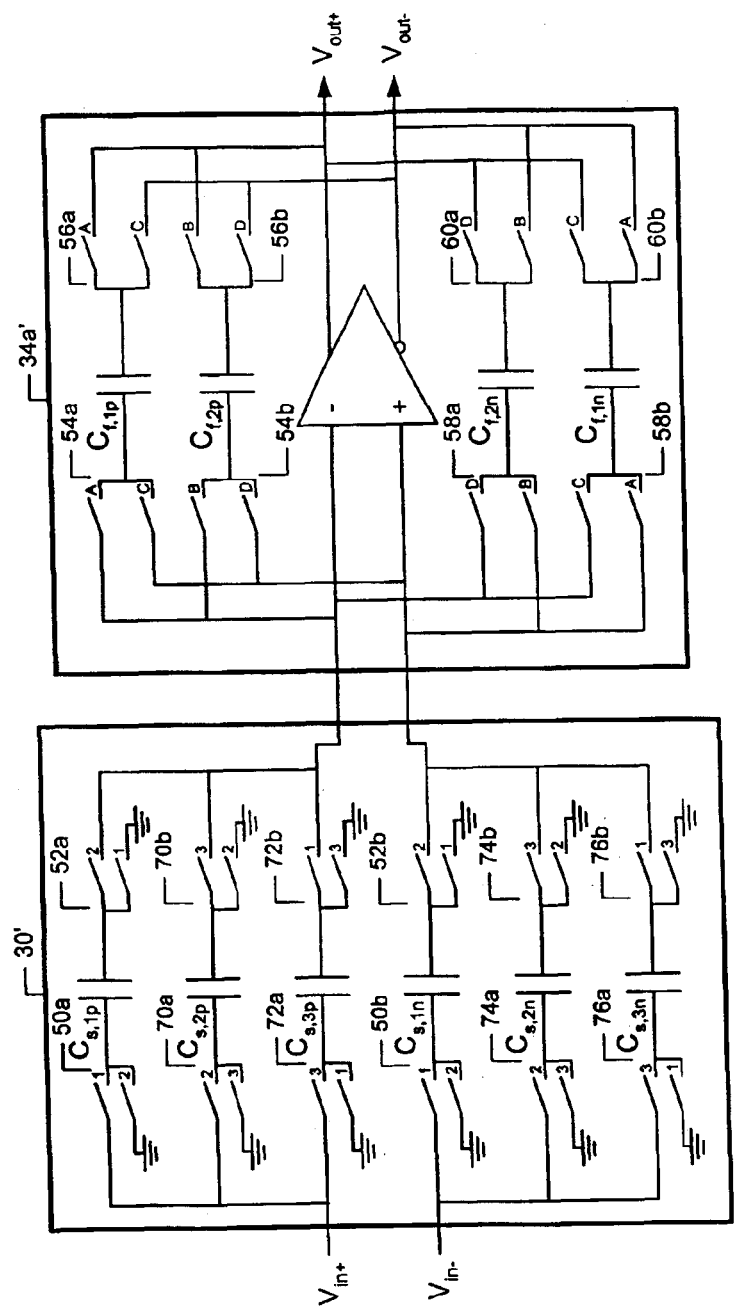
FIG. 9a is a circuit schematic of a switched capacitor three-phase sample and hold and two-phase resonator configured for capacitor switching.
Figure 9B:
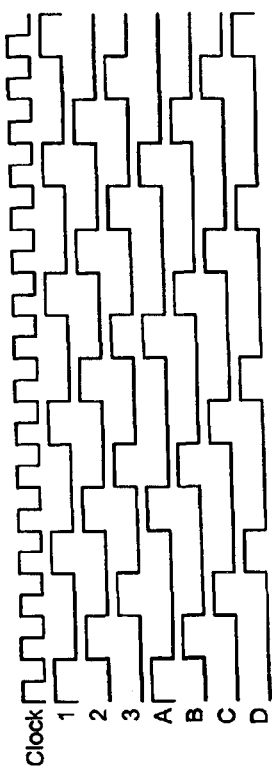
FIG. 9b is the accompanying timing diagram.

In FIG. 9a, the three-phase S/H circuit 30 is shown in conjunction with the second order, two-phase resonator 34a of FIG. 7a. FIG. 9a shows all of the elements of FIG. 7a plus additional capacitors and switches 70a, 70b, 72a, 72b, 74a, 74b, 76a, 76b, that are S/H circuit 30 of FIG. 5. In FIG. 10a, the three-phase S/H circuit 30 is used in conjunction with the second order, two-phase resonator 34a' of FIG. 8a. The associated timing diagrams are respectively FIGS. 9b, 10b.

Operation of the three-phase S/H circuit is the same for the embodiments shown in FIGS. 9a and 10a. The S/H circuits, respectively 30, 30', operate on a three-phase clock signal. During the first phase, capacitors Cs,1p and Cs,1n track and sample the input signal, and the charge on capacitors Cs,3p and Cs,3n is transferred to the resonator. On the second phase, capacitors Cs,2p and Cs,2n track and sample the input signal, and the charge on capacitors Cs,1p and Cs,1n is transferred to the resonator. On the third phase, capacitors Cs,3p and Cs,3n track and sample the input signal, and the charge on capacitors Cs,2p and Cs,2n is transferred to the resonator.

An advantage of using an odd-phase S/H circuit in conjunction with an even-phase resonator in a low distortion band-pass delta-sigma ADC in accordance with this disclosure is to reduce the complexity of the design and implementation of the passive electronic components used therein. Less effort is required in analog design and layout because of the relative imprecision that can be tolerated. Smaller geometries in an integrated circuit (IC) implementation are permitted thereby reducing IC die (chip area), lowering power consumption, and improving speed of operation. These benefits are realized without the performance penalty paid in a conventional ADC.

Figure 11:
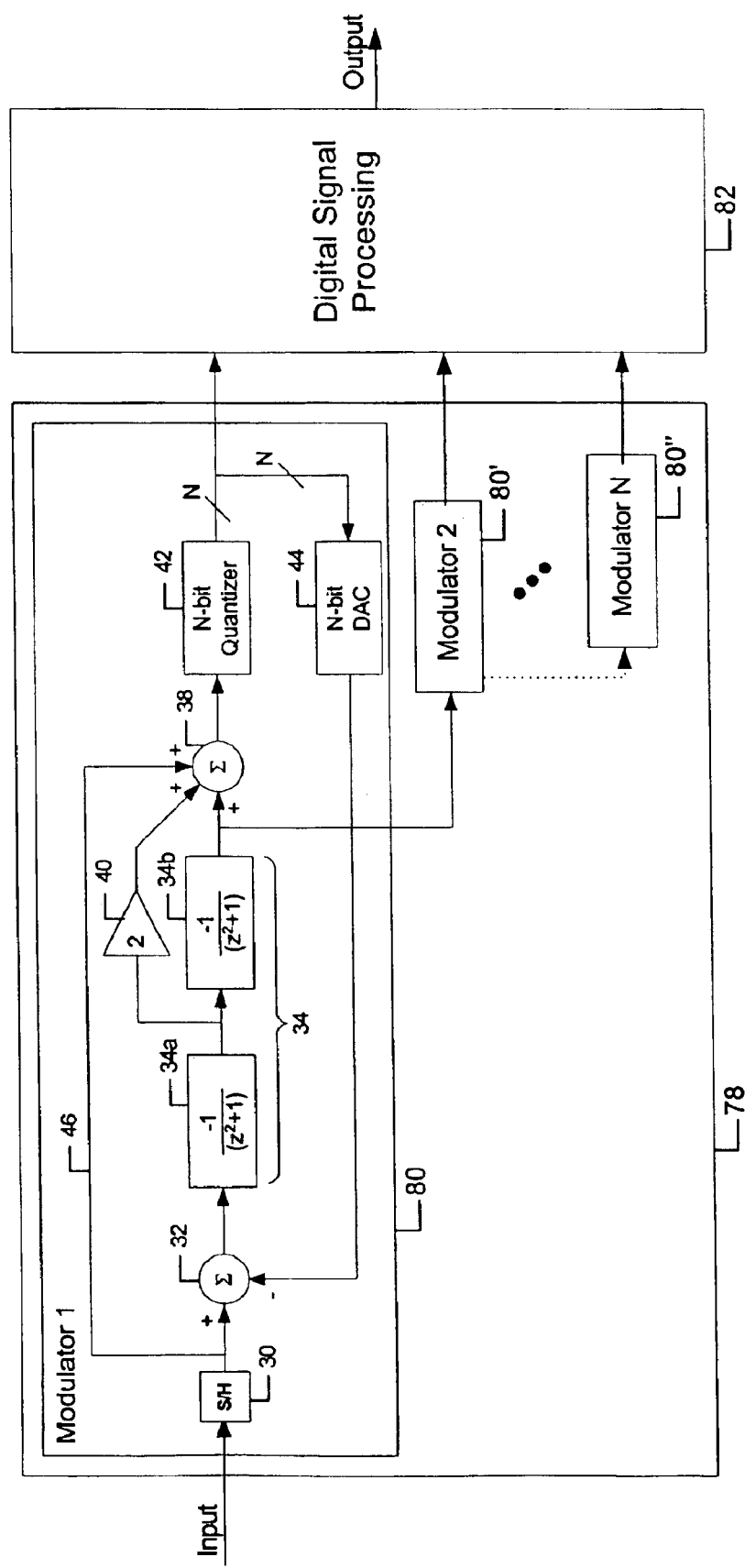
FIG. 11 is a block diagram of a MASH ADC in accordance with the invention.

Although single-loop, fourth order, band-pass delta-sigma ADCs are shown here as examples, this invention also applies to the well-known multiple-loop ("MASH" standing for multi-stage noise shaping) ADCs. It is noted that each loop of the single-loop or MASH ADC may be of arbitrary order. FIG. 11 shows a block diagram of such a MASH ADC having multiple modulators 80, 80', 80"" each, as in FIG. 5, in analog section 78 coupled to a digital signal processing output section 82.

Figure 12:
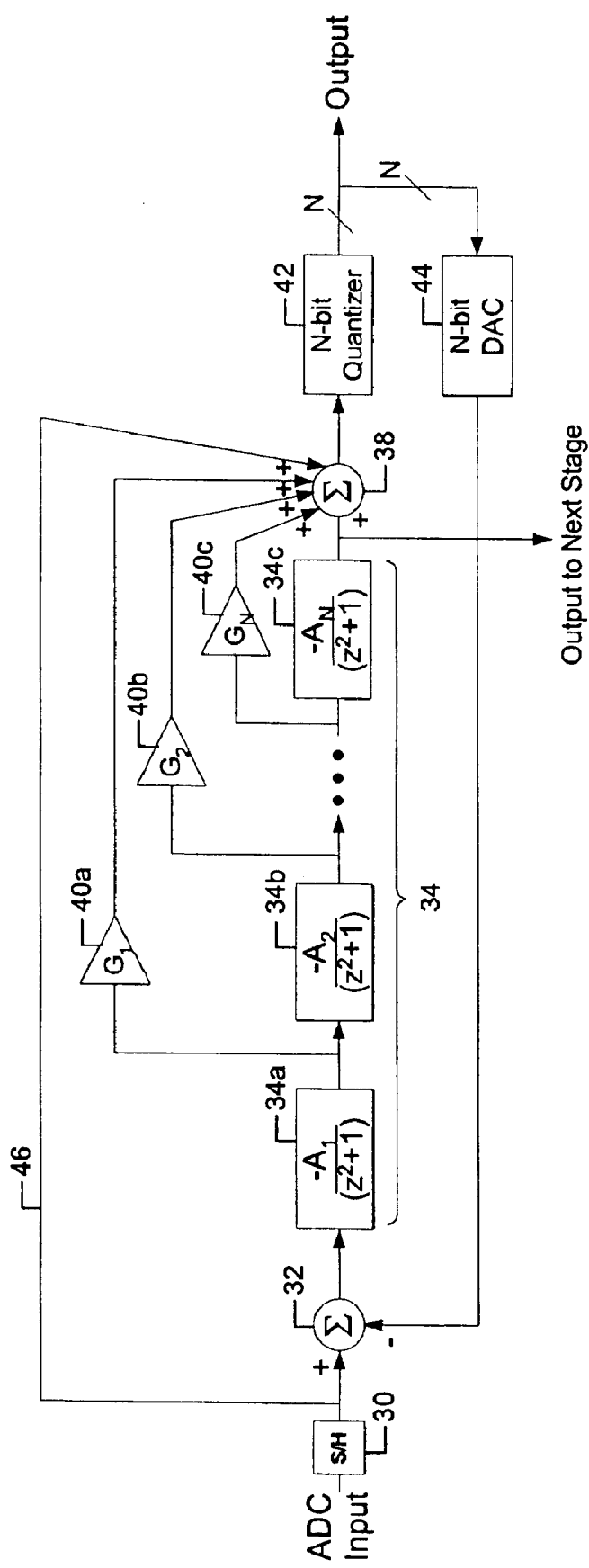
FIG. 12 is a block diagram showing a modulator as in FIG. 5 with additional resonators, in accordance with the present invention.

FIG. 12 shows another version of a modulator as in FIG. 5 using a 2 N order resonator. FIG. 12 is similar to FIG. 5 except that additional resonators (not all shown) including resonator 34d are included with associated feed forward gain stages 40b, . . . , 40c. Typically, the total number of resonators is 2 N, where N=1, 2, 3 . . . .

Embodiments of the present invention provide a band-pass delta-sigma Analog-to-Digital (ADC) having reduced sensitivity to mismatches between analog elements as compared to conventional band-pass delta-sigma ADCs. Embodiments provide low distortion for band-pass delta-sigma ADCs that generally includes odd-phase sample and hold (S/H) circuits in conjunction with multi-phase resonators. In some embodiments, a single-phase S/H circuit, or a three-phase S/H circuit, is used with a two-phase resonator to reduce sensitivity to mismatches between analog components.

While the present invention has been described in terms of the above-described embodiments, those skilled in the art will recognize that the invention is not limited to the embodiments described. The present invention may be practiced with various modifications and alterations within the spirit and scope of the appended claims.

What is claimed is:

1. A modulator comprising:
   an odd-phase sample and hold circuit having its output terminal coupled to a first node;
   an even-phase resonator coupled to both the first node and a second node;
   a quantizer having its input terminal coupled to the second node, the quantizer having an output terminal;
   a digital to analog converter having its input terminal coupled to the quantizer output terminal, the digital to analog converter having an output terminal coupled to the first node;
   a first feed forward stage coupled between the first node and the second node; and
   a second feed forward stage coupled between the resonator and the second node.

2. The modulator of claim 1, wherein the sample and hold circuit is a single phase sample and hold circuit.

3. The modulator of claim 1, wherein the sample and hold circuit is a three phase sample and hold circuit.

4. The modulator of claim 1, wherein the resonator is a switched capacitor resonator.

5. The modulator of claim 4, wherein the switched capacitor resonator comprises two sets of feedback capacitors.

6. The modulator of claim 5, wherein the switched capacitor resonator is adapted to receive at least four clock signals.

7. The modulator of claim 4, wherein the switched capacitor resonator is configured for capacitor switching.

8. The modulator of claim 4, wherein the switched capacitor resonator is configured for capacitor flipping.

9. The modulator of claim 1, in combination with a digital filter coupled to the quantizer output terminal.

10. The modulator of claim 1, in combination with at least one additional modulator having its input terminal coupled to the resonator.

11. The modulator of claim 1, wherein the quantizier is coupled directly to the second node.

12. The modulator of claim 1, where the resonator is a two phase resonator.

13. The modulator of claim 1, wherein the resonator is at least a four phase resonator.

14. The modulator of claim 1, wherein the first feed forward stage provides a gain of about one, and the second feed forward stage provides a gain of about 2.

15. The modulator of claim 1, wherein the second feed forward stage is coupled to the resonator between a first and a second stage of the resonator.

16. The modulator of claim 1, wherein the resonator is a 2N order resonator, N being a positive integer.

17. A method of modulating analog signal, comprising the acts of:
   sampling and holding the analog signal using an odd number of phases;
   applying the sampled and held sign to an even-phase resonator;
   quantizing a sum of the sampled and held signal, an output signal of the resonator, and a signal from the resonator thereby to provide a digital output signal; and
   applying the digital output signal to the resonator.

18. The method of claim 17, wherein the sampling and holding uses one phase.

19. The method of claim 17, wherein the sampling and holding uses three phases.

20. The method of claim 17, wherein the resonator is a two phase resonator.

21. The method of claim 17, wherein the resonator is at least a four phase resonator.

22. The method of claim 17, further comprising the act of applying at least four clock signals to the resonator.

23. The method of claim 17, further comprising the act of configuring the resonator for one of capacitor switching or capacitor flipping.

24. The method of claim 17, further comprising the act of applying predetermined gain to the sampled and held signal and to the signal from the resonator prior to the act of quantizing the sum.

25. The method of claim 17, wherein the resonator is a 2N order resonator, N being a positive integer.

* * * * *